United States Patent [19]
Gheorghiu et al.

[11] Patent Number: 5,266,747
[45] Date of Patent: Nov. 30, 1993

[54] MINIMUM FOOTPRINT RECONFIGURABLE INPUT/OUTPUT CIRCUIT

[75] Inventors: Adrian G. Gheorghiu, Ferndale; Gregory B. Dahlin, Livonia; Doo M. Yee, Westland; Terrence D. Prestel, Livonia, all of Mich.

[73] Assignee: Ford Motor Company, Dearborn, Mich.

[21] Appl. No.: 752,812

[22] Filed: Aug. 30, 1991

[51] Int. Cl.⁵ .............................................. H05K 1/00
[52] U.S. Cl. ..................................... 174/254; 174/261; 361/767
[58] Field of Search ............... 174/255, 250, 254, 262, 174/266, 261; 361/403, 404, 406, 397

[56] References Cited
U.S. PATENT DOCUMENTS 4,488,267 12/1984 Harrison .
5,061,825 10/1991 Catlin .................... 174/261

Primary Examiner—Leo P. Picard
Assistant Examiner—Cheryl R. Figlin
Attorney, Agent, or Firm—Roger L. May; Allan J. Lippa

[57] ABSTRACT

A circuit board includes conductive pads formed in a predetermined arrangement to permit a standardized component package to be properly placed in either of two electrical arrangements, such as an input or output buffer circuit, without separate mounting footprints for each type of electrical component, such as a transistor to be mounted on the footprint. A footprint comprising pads corresponding to the arrangement of terminals on a standardized package is provided with an extension including at least one pad so that a standardized package could be mounted in a rotated position. A circuit board arrangement incorporating the minimum footprint can also include adjacent pairs of pads to be located about the minimum footprint. The footprint and adjacent pairs of pads permits interchanging surface mount NPN and PNP transistors, and selection of the proper operating values for the surface mount resistors mounted on the pads, but does not affect the assembly of surface mount resistors or their location on the circuit board.

6 Claims, 3 Drawing Sheets

MINIMUM FOOTPRINT RECONFIGURABLE INPUT/OUTPUT CIRCUIT

TECHNICAL FIELD

The present invention relates generally to microcontroller circuit board constructions, and more particularly to a circuit board configuration adapted to accommodate surface mount electronic components of either an input or an output buffer circuit within a minimum circuit board area.

BACKGROUND ART

The advancements in microprocessing and integrated circuit technologies offer the opportunity to control a wide variety of pneumatic, hydraulic, mechanical and electrical systems. Such technology has also been developed in and applied to motor vehicles. The versatility of microcontroller systems makes them well adapted to control a wide variety of functions performed by the components and accessories of a motor vehicle. However, the electrical signals from sensors or to actuators communicated to or from the microcontroller must be buffered so as to form an acceptable input to or output from the microprocessor. As they are used in this application, the terms microcontroller or microcontroller system are used generically and include both systems having microprocessors without resident memory and microcomputers having resident memory.

A previously known form of buffer circuit comprises a transistor and resistors which are selected in accordance with the input o output signal to be transmitted or received. In particular, an NPN transistor Q1, as shown by circuit 110 in FIG. 4, may form an input buffer by coupling a resistor R1 between its base and the input terminal I1 at terminal 20, a resistor R2 between its base and its emitter which is also tied to the ground terminal 18, a resistor R3 between the power terminal 16 and the collector of the transistor, and a resistor R4 between the collector and the buffer output terminal 22 coupled to an input port IP1 of the microcontroller. Such an input buffer is useful when the input is switched to a positive voltage.

Another common type of input buffer uses a PNP transistor Q2, as shown in circuit 114 of FIG. 4, with the base coupled to the input terminal I2 at terminal 22 through resistor R4. Resistor R3 is connected between the base and emitter and the emitter is also connected to the power terminal 16. The collector is connected through resistor R2 to the ground terminal 18. The collector is also connected to the input port IP2 of the microcontroller at terminal 20 through resistor R1. Such an input buffer is particularly useful when coupling in a low side switch for switching to ground.

A common type of output buffer comprises a NPN transistor Q1 (FIG. 4, circuit 116) with its base terminal connected to the output port OP1 of the microcontroller at terminal 20 through resistor R1. The base terminal is also connected to the ground terminal 18 through resistor R2, its emitter connected to the ground terminal, the collector is connected to the power terminal 16 through resistor R3 and to the output terminal O1 at terminal 22 through resistor R4. This is an active pull-down output buffer or low side switch used where current sinking to ground is required.

Another common type of output buffer uses a PNP transistor Q2 (FIG. 4, circuit 112) with its base coupled to the output port OP2 of the microcontroller through resistor R4. The base is also connected to the power supply terminal 16 through resistor R3, and the emitter is connected to the power terminal 16. The collector is connected to the ground terminal 18 through resistor R2 and to the output terminal 02 at terminal 20 through resistor R1. This is an active pull-up type of output buffer and used when output is delivered to a device requiring current sourcing.

In view of the needs discussed above for both NPN and PNP buffer circuits for the microcontroller, the configuration of a generic circuit board can cause substantial packaging problems. The problems of circuit variety and associated packaging are particularly acute in motor vehicle systems, especially for automobile manufacturers having many model lines and options. In particular, it may be desirable for the circuit board to be designed to accommodate a generic input/output buffer circuit for each microcontroller terminal to be made available for any of a variety of uses. As a result, the circuit board can be configured for placement of the resistors R1, R2, R3, R4 as well as the PNP and NPN transistor. While the schematic diagram for such a generic buffer arrangement is quite simple as shown in FIG. 3, the layout of such a generic circuit arrangement substantially increases the size of the circuit board packaging.

The use of circuit board space has been only partly addressed by the fact that component packages mounted to circuit boards have been standardized. Standardization dictates predetermined size packages and corresponding placements of conductive pads arranged on the circuit boards so that each terminal of a standardized component package can be mounted in electrical contact with a pad regardless of the performance values of the component mounted in that position. However, generic circuit boards would allow the arrangement of an active pull-down input or output buffer, or an active pull-up input or output buffer, at each terminal to a microcontroller chip. Such construction would increase the size of footprint even though only part of it is actually used. For example, it has previously been necessary to provide both a first footprint with three pads for surface mounting of a standardized NPN transistor package, and a second, separate footprint with three pads for mounting a standardized PNP transistor package. Moreover, in many cases, each separate transistor footprint requires additional peripheral pads for mounting the resistors R1-R4 around the transistor footprint pads actually chosen to be used for a particular buffer circuit. Thus, not only the additional transistor footprint increases the size of the circuit board area used for the generic circuit which is necessary, but the surrounding pads for set up components also increases the area that must be occupied to build a single circuit on the generic circuit board.

TECHNICAL PROBLEM RESOLVED

The present invention overcomes the above-mentioned disadvantages by providing a circuit board footprint adapted to receive differently configured electrical components having a common standardized package with an area smaller than previous layouts. In the preferred embodiment, a standardized surface mount transistor package can be mounted in the same footprint regardless of its electrical function. The minimum footprint not only reduces the size of the footprint necessary to interchange NPN and PNP transistors, but substantially reduces the size of the footprint area required to set up components for the input or output buffer circuits that may be built upon the generic arrangement on the circuit board. As a result, the present invention substantially reduces board space as well as board cost requirements for building generic circuit boards which are to be adapted for a wide variety of circuits. The present invention is particularly useful in accommodating the wide variety of systems employed in motor vehicle manufacturing and addressing the associated packaging problems.

Generally, the footprint requires at least one pad in addition to the number of pads in a configuration corresponding to the standardized arrangement of terminals in a standardized transistor package. The additional pad is located at a position with respect to the remaining pads for rearranging the standardized component package in a rotated position. In addition, conductive pads for additional components such as buffer circuit resistors can also be included on the board to supplement the footprint. Preferably, resistor pads are arranged in pairs surrounding the minimum footprint for a standardized package according to the present invention to serve both the original and rotated positions of the package on the footprint configuration.

The present invention will be better understood by reference to the following detailed description. While the detailed description refers in particular to an SOT-23 standard transistor package and corresponding footprint, it will be understood that the present invention can be practiced with other standardized packages for electrical components and is to be understood as not limited to the illustrated embodiments. Variations in the arrangement of pads may be necessary, depending on the size, spacing and arrangement of pads which must be used to make up the footprints that match the terminal arrangements on the standardized package, surface mount components, without departing from the scope of the present invention.

BRIEF DESCRIPTION OF THE DRAWINGS

The present invention will be better understood by reference to the following detailed description of a preferred embodiment when read in conjunction with the accompanying drawing in which like reference characters refer to like parts throughout the views and in which.

BEST MODE FOR CARRYING OUT THE INVENTION

Figure 3:
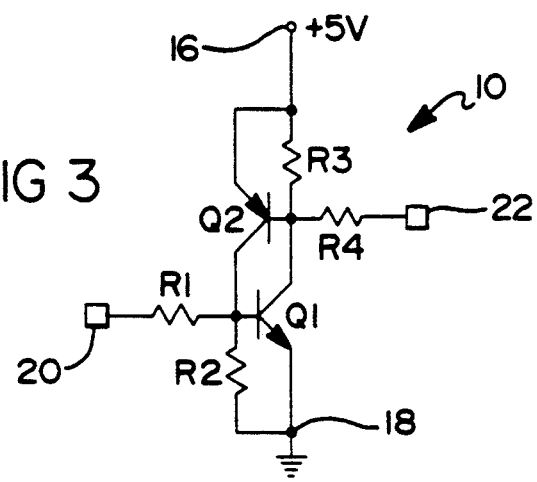
FIG. 3 is a schematic diagram of a generic input/output buffer circuit that can be constructed in the footprint shown in FIG. 2.

Referring first to FIG. 3, a generic input/output circuit 10 includes both a PNP transistor Q2 and an NPN transistor Q1. The circuit also includes a voltage supply terminal 16 and a ground terminal 18. In addition, a terminal 20 at one end of resistor R1 forms an input or output terminal for the circuit while an additional terminal 22 at one end of resistor R4 forms the other output or input terminal for the circuit 10. Of course, it will be understood that the generic circuit 10 does not define an operative circuit, but rather a circuit configuration which could use either the transistor Q2 or the transistor Q1 as will be described in greater detail hereinafter.

Figure 1:
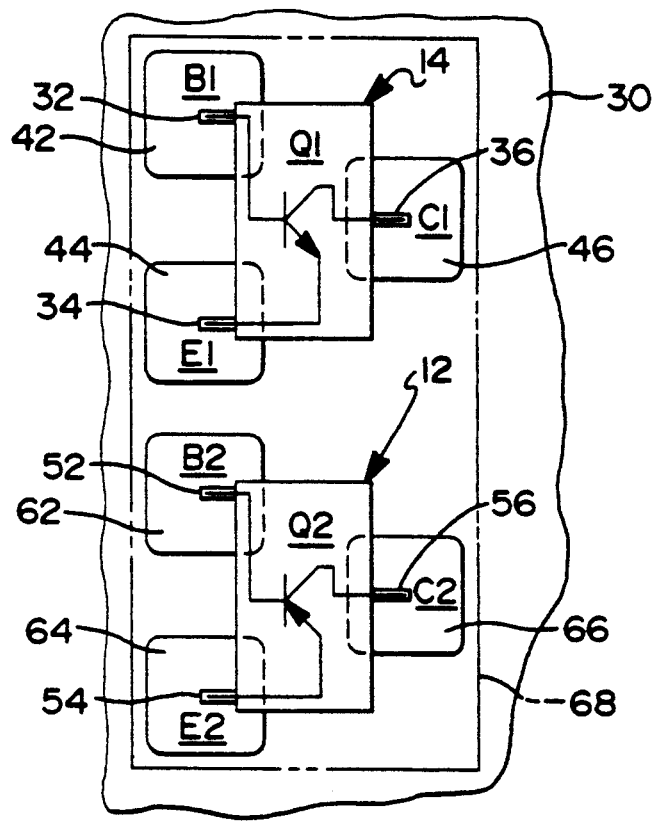
FIG. 1 is a broken plan view of a prior art generic circuit board footprint for mounting an SOT-23 standardized package, surface mount transistors.

In order to set up such a circuit, previously known generic circuit boards, represented at 30 in FIG. 1, would include conductor pads for mounting both transistor Q2 and transistor Q1. The NPN transistor Q1 is shown in a surface mount package designated 14 and representing a standardized package. In the preferred embodiment, the standardized package has a rectangular polyhedron shape. For example, in the preferred embodiment, the transistor package 14 is an SOT-23 size component having terminals 32, 34 and 36 as shown in FIG. 1. Accordingly, circuit board 30 must be provided with pads 42, 44 and 46 aligned in a predetermined pattern arranged to correspond with the terminals 32, 34 and 36, respectively.

Similarly, the transistor Q2 is provided in a surface mount, standardized package designated 12 and is configured according to the same as standard package for surface mount components, i.e. SOT-23. Accordingly, package 12 includes leads 52, 54 and 56 in substantially the same configuration as the leads 32, 34 and 36 of the package 14. As a result, it requires a circuit board footprint comprising a plurality of pads 62, 64 and 66 in substantially the same configuration as the pads 42, 44 and 46. However, since the NPN transistor Q1 is electrically different from the PNP transistor Q2, the transistors cannot replace each other on the same set of pads with the same set of supporting resistors. The combined arrangement of pads for both of the packages 14 and 12 define a footprint 68.

Figure 2:
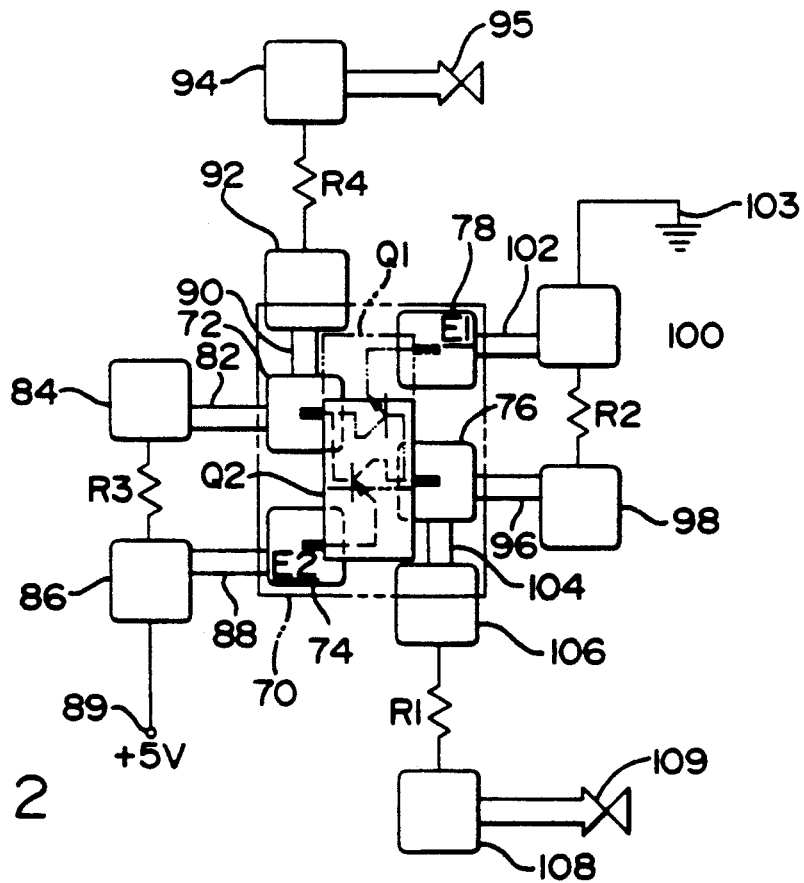
FIG. 2 is a plan view of a footprint configuration according to the present invention for circuit board pads constructed in accordance with the present invention.

Referring now to FIG. 2, the present invention reduces the size of the footprint required to provide the option of mounting either package 14 or package 12 on the circuit board 30. In particular, footprint 70 is formed by arranging pads 72, 74, 76 and 78 as shown in FIG. 2. As shown in solid lines in FIG. 2, the transistor package 12 having terminals 52, 54 and 56 can be positioned so that its terminals coincide with the pads 72, 74 and 76, respectively. In addition, transistor package 14 can be positioned so that leads 36, 32 and 34 coincide with the placement of pads 72, 76 and 78, respectively, when another electrical component, such as an NPN transistor configuration, is required.

Since only one transistor is used in an actual input or output buffer circuit, pad 72 forms a connection for the collector of transistor Q1 or for the base of transistor Q2. In either event, pad 72 is coupled by a conductive trace 82 to a pad 84 adapted to receive a lead from a standardized package for R3,. Pad 84 is paired with adjacent pad 86 and adapted to receive the other conductor terminal of the surface mount, standardized package for resistor R3 and is in turn coupled through a conductive trace 88 to the pad 74. As a result, when the pad 74 receives the emitter terminal 54 of transistor package 12, both the emitter terminal 54 and the resistor R3 are coupled for receipt of a supply voltage as indicated at terminal 89.

The pad 72 is also coupled through a conductive trace 90 to a pad 92. The pad 92 is paired with a pad 94 so as to receive the leads of a surface mount, standardized package for resistor R4. The pad 94 is adapted to receive an input or output as designated at 95. Pad 76 forms a connection for the collector of transistor Q2 and the base of transistor Q1. The pad 76 is coupled through a conductive trace 96 to a pad 98. The pad 98 is paired with a pad 100 for receipt of the leads from the surface mount, standardized package for resistor R2. The pad 100 is in turn connected by a conductive trace 102 to the pad 78. Accordingly, when the pad 78 receives the emitter terminal 34 of the transistor package 14, both a terminal of resistor R2 and the emitter terminal 34 can be coupled to pad 100 and to ground as schematically designated at 103.

In addition, the pad 76 is coupled through a conductive trace 104 to a pad 106. The pad 106 is paired with a pad 108 for receipt of the terminals of the surface mount, standardized package for resistor R1 for coupling one of its terminals to an input/output as designated schematically at 109.

The circuit board arrangement as described above provides a generic coupling for resistors R1-R4 of an input or output buffer circuit and thus further avoids the need for multiple separate pad arrangements for each type of transistor as with previous footprint 68 in a generic circuit board arrangement. The reduced footprint 70 provided by the pad arrangements for the NPN and PNP transition, as well as the space that is provided by the generic relation of pad pairs for mounting the resistors R1-R4 conserves a substantial amount of circuit board area occupied to accommodate circuits for a microcontroller. The asymmetric arrangement of FIG. 2, wherein the pads are not symmetrically aligned with respect to orthogonal centerlines through the pads, provides a particularly compact footprint.

Figure 4:
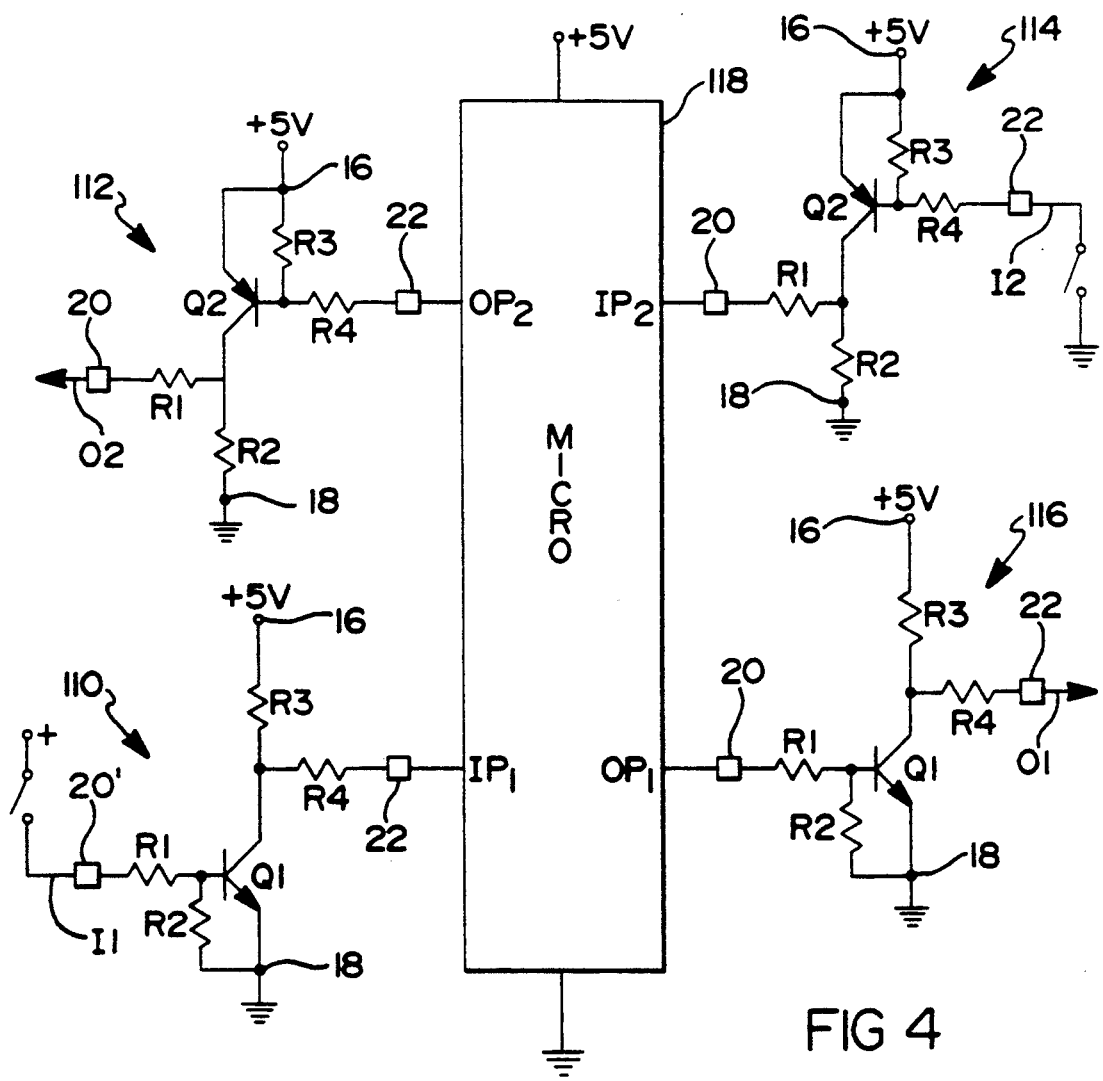
FIG. 4 is a schematic diagram showing a microcontroller circuit using a variety of input and output buffers.

As a result, it will be understood that a large number of circuit configurations can be provided in the area previously occupied by substantially fewer generic circuit arrangements. In addition, it will be understood that as shown in FIG. 4, use of an NPN or PNP transistor as either an input or an output ca be provided at any of the locations including a footprint configuration as taught by the present invention. The additional pad enables an NPN transistor package to occupy two of the same pads as a PNP transistor package, and the additional pad of the footprint 70 is located with respect to the two pads so as to occupy the position registering with the central or emitter terminal of the SOT 23 package if the SOT 23 package were rotated 180° within the surface plane of the circuit board.

An example of the space saving available with the footprint configuration of pads according to the present invention may be described in detail with respect to the SOT-23 standard. In the previous six pad, separated placement configuration shown in FIG. 1, the distance between pads 42 and 44 may be 1 millimeter whereas the sides of each pad are approximately 1.4 millimeters long. Moreover, the spacing between the pads 44 and 52 may be about 0.5 millimeters. As a result, the area of the footprint 68 may be approximated by considering the footprint 8.1 millimeters long and 3.8 millimeters wide including the 1 millimeter space between the 1.4 millimeter sides of pads 64 and 66. The area is approximately 30.78 square millimeters.

On the other hand, the spacing between the top edge of pad 78 and the top edge of pad 72 shown in footprint 70 in FIG. 2 is 1.2 millimeters. The pads 72 and 74 have the same 1.4 millimeter sides and a spacing of 1 millimeter from each other. The total length of the footprint is 5.0 millimeters. In addition, the 1.4 millimeter side length of the pads 74 and 76, separated by a 1 millimeter length, form a width of 3.8 millimeters. As a result, the approximated area of the footprint 70 according to the present invention is 19.0 square millimeters and represents a substantial reduction from the size of the previously known generic circuit board configuration.

Nevertheless, footprint 70 is adapted to form any one of the active pull-down input buffer circuit 110, the active pull-up output buffer 112, the active pull-up input buffer 114, and the active pull-down output buffer 116 shown in FIG. 4. The same pad arrangement and footprint pattern can be provided in a plurality of places on the circuit board. Accordingly, the present invention reduces the packaging problems and enhances the utility of pad patterns required to make generic circuit boards manufactured for a wide variety of circuits.

The invention is particularly useful to the wide variety of circuits which may be encountered in motor vehicles where packaging must be minimized. Generic circuit boards according to the present invention can be adapted for a wider variety of functions and optional accessories that may be operated from a single microcontroller 118 than previously known circuit board arrangements. Moreover, the rotated placement prevents inadvertent mounting of additional but unnecessary components in a fully open pad since the mounting of the properly selected component package occupies pads that would be required to mount the additional package.

Figure 5:
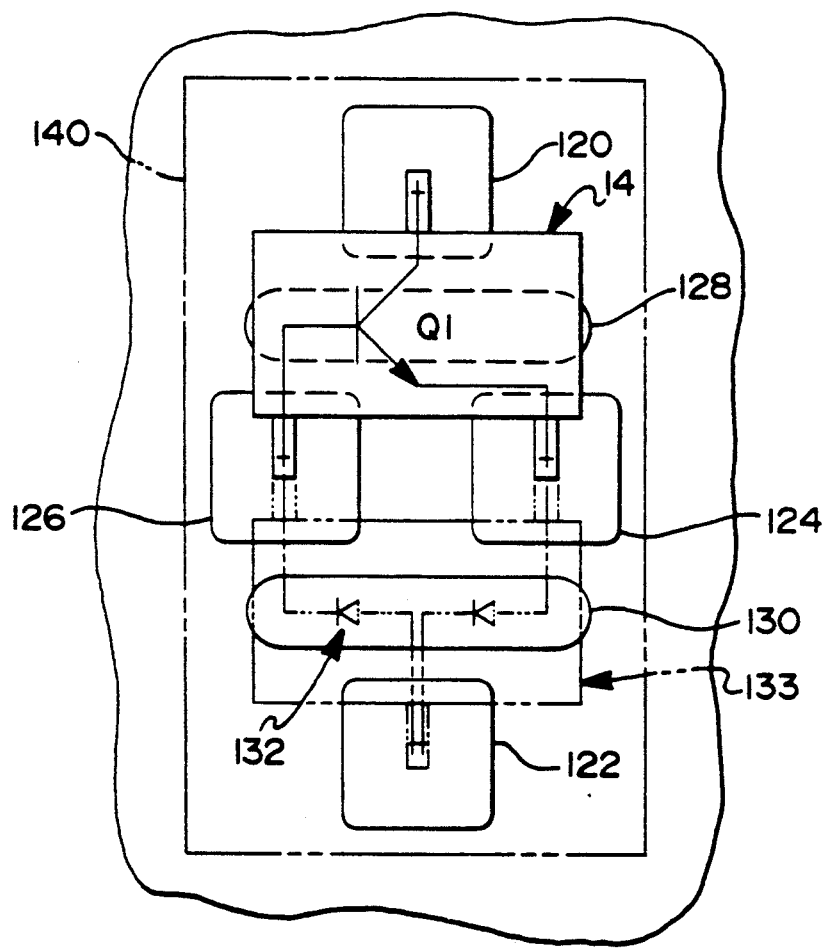
FIG. 5 is a plan view of a footprint showing a modified pad arrangement according to the present invention.

FIG. 5 discloses an alternative embodiment in which alternate pads 120 and 122 are symmetrically aligned with respect to the pads 124 and 126. The size, shape and spacing between the pads is according to the same conventions used in the other embodiment. However, the symmetrical positioning of the pads 120 and 122 defines a footprint 140 that occupies a slightly greater space on the circuit board than the staggered alignment shown in the other embodiment. Nevertheless, standardized component packages, such as the SOT-23 package shown in the drawing, can be mounted in a mirrored image location with respect to the predetermined pad layout in a board space substantially smaller than previously required for a pair of three pad footprints. Moreover, although the same SOT-23 standardized packages are to be mounted, FIG. 5 demonstrates that substantially different electrical functions can be provided in the standardized package. Standardized package 133 includes a dual diode clamping circuit 130. Moreover, FIG. 5 demonstrates that the more compact pad configuration of the present invention still permits the use of dummy pads 128 and 130 for consistent support of the surface mount, standardized component packages.

Having thus described the present invention, many modifications thereto will become apparent to those skilled in the art to which it pertains without departing from the scope and spirit of the present invention as defined in the appended claims.

We claim:

1. A pad footprint for generic circuit board layouts for a standardized package circuit component:
   a predetermined layout of a predetermined number of pads on a circuit board area, said predetermined number of pads corresponding to the number of leads on a predetermined standardized component package having an arrangement of leads, and each pad located to register with a lead of the standardized component package; and an additional footprint extension adjacent said first circuit board area comprising at least one pad in a mirrored image location with respect to said predetermined layout for reversibly mounting said standardized component on said predetermined layout.

2. A footprint for mounting standardized package, surface mount components comprising:

a first set of three pads, each pad being positioned for registering engagement with leads of a predetermined standardized package, surface mount component;

a fourth pad located with respect to two of said pads so as to occupy the position of said third pad with respect to said two pads when said standardized package is rotated 180° within the surface plane of said circuit board.

3. The invention as defined in claim 2 and further comprising a plurality of symmetrical pairs of pads surrounding said footprint.

4. The invention as defined in claim 3 wherein said plurality of pairs of pad comprises four pairs.

5. The invention as defined in claim 2 wherein said standardized package, surface mount component is an SOT-23 transistor package.

6. The invention as defined in claim 5 wherein said component is taken from the group of NPN and PNP transistors.

* * * * *

UNITED STATES PATENT AND TRADEMARK OFFICE
CERTIFICATE OF CORRECTION

PATENT NO. : 5,266,747
DATED : November 30, 1993
INVENTOR(S) : Adrian G. Gheorghiu et al It is certified that error appears in the above-indentified patent and that said Letters Patent is hereby corrected as shown below:

Column 1, line 32, delete "o" and substitute --or--.

Column 5, line 41, after "output" delete "ca" and substitute --can--.

Column 6, line 63, after "component" insert --comprising--.

Column 7, line 7, Claim 1, after "component" insert --package--.

Signed and Sealed this

Twenty-fourth Day of May, 1994

Attest:

BRUCE LEHMAN

*Attesting Officer*     *Commissioner of Patents and Trademarks*